(12) United States Patent
Huang

(10) Patent No.: US 10,778,242 B2
(45) Date of Patent: Sep. 15, 2020

(54) ANALOG-TO-DIGITAL CONVERTER DEVICE

(71) Applicant: Realtek Semiconductor Corporation, Hsinchu (TW)

(72) Inventor: Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/524,401

(22) Filed: Jul. 29, 2019

(65) Prior Publication Data

US 2020/0228132 A1 Jul. 16, 2020

Related U.S. Application Data

(60) Provisional application No. 62/791,128, filed on Jan. 11, 2019, provisional application No. 62/806,026, filed on Feb. 15, 2019.

(51) Int. Cl.
*H03M 1/36* (2006.01)
*H03M 1/38* (2006.01)

(52) U.S. Cl.
CPC .................................. *H03M 1/38* (2013.01)

(58) Field of Classification Search
CPC .......... H03M 1/38; H03M 1/12; H03M 1/802; H03M 1/804; H03M 1/806; H03M 1/00

(Continued)

(56) References Cited

U.S. PATENT DOCUMENTS 6,587,066 B1 * 7/2003 Somayajula ........ H03M 1/0697
341/120
8,279,102 B2 10/2012 Lai et al.
(Continued)

FOREIGN PATENT DOCUMENTS

TW 201251341 A1 12/2012
TW 201715849 A1 5/2017

OTHER PUBLICATIONS

T.Cho et al., "A 10 b, 20 Msample/s, 35 mW pipeline A/D converter," IEEE Journal of Solid-State Circuits, vol. 30, No. 3, pp. 166-172, Mar. 1995.

(Continued)

*Primary Examiner* — Jean B Jeanglaude
(74) *Attorney, Agent, or Firm* — Locke Lord LLP; Tim Tingkang Xia, Esq.

(57) ABSTRACT

An analog-to-digital converter (ADC) device includes capacitor arrays, a successive approximation register (SAR) circuitry, and a switching circuitry. When a first capacitor array of the capacitor arrays samples an input signal in a first phase, a second capacitor array of the capacitor arrays outputs the input signal sampled in a second phase as a sampled input signal. The SAR circuitry performs an analog-to-digital conversion on a combination of the sampled input signal and a residue signal generated in the second phase according to a conversion clock signal, in order to generate a digital output. The switching circuitry includes a first capacitor that stores the residue signal generated in the second phase. The switching circuitry couples the second capacitor array and the first capacitor to an input terminal of the SAR circuitry, in order to provide the combination of the sampled input signal and the residue signal.

20 Claims, 8 Drawing Sheets

(58) Field of Classification Search
USPC .......................................... 341/161, 155, 172
See application file for complete search history.

(56) References Cited

U.S. PATENT DOCUMENTS

| | | | |
|---|---|---|---|
| 8,710,896 B2 | 4/2014 | Allen et al. | |
| 8,786,484 B2* | 7/2014 | Cheong | H03M 1/0682 |
| | | | 341/155 |
| 8,797,204 B2* | 8/2014 | Yoon | H03M 1/16 |
| | | | 341/155 |
| 8,952,839 B2* | 2/2015 | Wang | H03M 1/38 |
| | | | 341/155 |
| 9,030,346 B2* | 5/2015 | Dey | H03M 1/109 |
| | | | 341/118 |
| 9,041,569 B2 | 5/2015 | Zhou et al. | |
| 9,106,243 B2* | 8/2015 | Lee | H03M 1/1023 |
| 9,287,891 B1 | 3/2016 | Lee et al. | |
| 9,847,790 B2 | 12/2017 | Liu | |
| 10,050,639 B1* | 8/2018 | Berens | H03M 1/069 |
| 10,171,097 B1* | 1/2019 | Lin | H03M 1/0863 |
| 2008/0129573 A1 | 6/2008 | Mueck et al. | |
| 2011/0122006 A1* | 5/2011 | Liao | H03M 1/1047 |
| | | | 341/120 |
| 2012/0081244 A1 | 4/2012 | Lai et al. | |
| 2013/0147649 A1* | 6/2013 | Cheong | H03M 1/0682 |
| | | | 341/172 |
| 2014/0049872 A1* | 2/2014 | Huang | H01L 23/5223 |
| | | | 361/301.4 |
| 2014/0246562 A1* | 9/2014 | Van Blerkom | H03M 1/403 |
| | | | 250/208.1 |
| 2014/0320330 A1* | 10/2014 | Yang | H03M 1/12 |
| | | | 341/172 |
| 2018/0183450 A1 | 6/2018 | Liu | |

OTHER PUBLICATIONS

R. Lotfi et al., "A 1-V MOSFET-Only Fully-Differential Dynamic Comparator for Use in Low-Voltage Pipelined A/D Converters", Signals, Circuits and Systems, 2003. SCS 2003. International Symposium on.

* cited by examiner

ANALOG-TO-DIGITAL CONVERTER DEVICE

RELATED APPLICATIONS

This application claims priority to U.S. Provisional Application Ser. No. 62/791,128, filed Jan. 11, 2019, and also claims priority of U.S. Provisional Application Ser. No. 62/806,026, filed Feb. 15, 2019, all of which are herein incorporated by reference in their entireties.

BACKGROUND

Technical Field

The present disclosure relates to an analog-to-digital converter (ADC) device. More particularly, the present disclosure relates to a time interleaved successive approximation register ADC having a noise shaping function.

Description of Related Art

An analog-to-digital converter (ADC) has been widely applied to various electronic devices, in order to covert an analog signal to a digital signal for subsequent signal processing. As the need of processing data with high resolution (for example, video data) rises, the ADC is often the key component in the system. However, in practical applications, performance of the ADC is affected by serval non-ideal factors, such as process variations, quantization noise, thermal noise, and so on.

SUMMARY

Some aspects of the present disclosure are to provide an analog-to-digital converter (ADC) device that includes capacitor arrays, a successive approximation register (SAR) circuitry, and a switching circuitry. The capacitor arrays are configured to sample an input signal by turns, in which when a first capacitor array of the capacitor arrays is configured to sample the input signal in a first phase, a second capacitor array of the capacitor arrays is configured to output the input signal sampled in a second phase as a sampled input signal. The first phase is a current phase, and the second phase is prior to the first phase. The SAR circuitry is configured to perform an analog-to-digital conversion on a combination of the sampled input signal and a residue signal generated in the second phase according to a conversion clock signal, in order to generate a digital output. The switching circuitry includes a first capacitor configured to store the residue signal generated in the second phase. The switching circuitry is configured to couple the second capacitor array and the first capacitor to an input terminal of the SAR circuitry, in order to provide the combination of the sampled input signal and the residue signal.

As described above, the ADC device of embodiments of the present disclosure are able to provide a circuit architecture that has a noise-shaping function and time-interleaved conversion. As a result, the overall performance of the ADC device can be improved.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in each figure are designated with the same reference number.

Figure 1A:
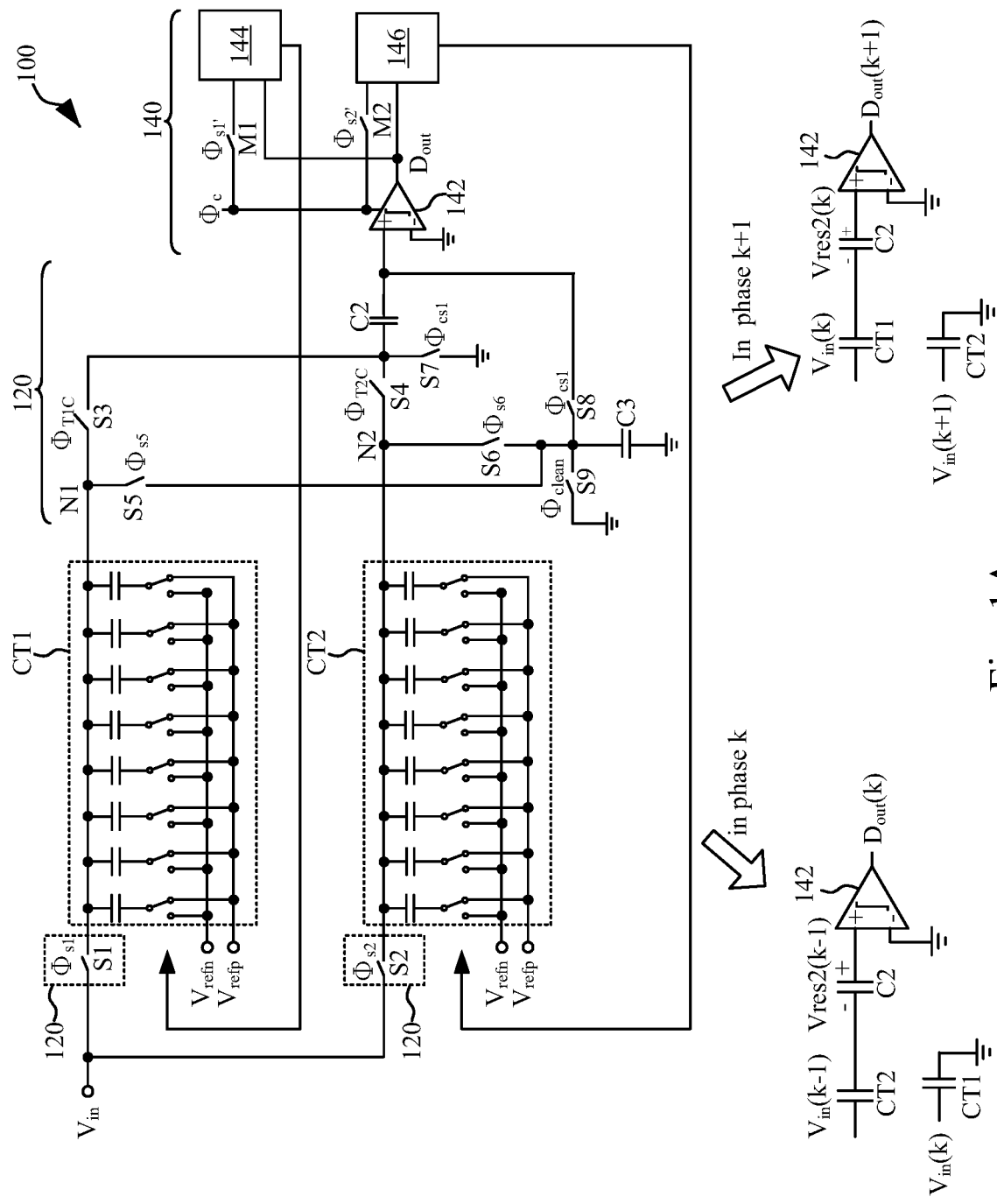
FIG. 1A is a schematic diagram of an analog-to-digital converter (ADC) device according to some embodiments of the present disclosure.

FIG. 1A is a schematic diagram of an analog-to-digital converter (ADC) device 100 according to some embodiments of the present disclosure. In some embodiments, the ADC device 100 operates as a time interleaved successive approximation register (SAR) ADC.

The ADC device 100 includes binary capacitor arrays CT1 and CT2, a switching circuitry 120, and a SAR circuitry 140. The SAR circuitry 140 includes a comparator circuit 142, control logic circuits 144 and 146, and switches M1-M2. In some embodiments, the binary capacitor arrays CT1 and CT2 cooperate with the switching circuitry 120, in order to provide a noise shaping function to the ADC device 100.

The binary capacitor arrays CT1 and CT2 samples an input signal $V_{in}$ by turns, in order to provide the sampled input signal $V_{in}$ to the SAR circuitry 140. The SAR circuitry 140 performs a binary search algorithm based on the sampled input signal $V_{in}$ and common voltages $V_{refn}$ and $V_{refp}$. In some embodiments, the binary search algorithm is performed under control of one of the control logic circuits 144 and 146. The comparator circuit 142 and the control logic circuits 144 and 146 are enabled by a clock signal $\phi_c$ (e.g., a conversion clock signal) to perform the binary search algorithm, in order to execute an analog-to-digital (A/D) conversion on the sampled input signal $V_{in}$ to decide a digital output $D_{out}$.

The switch M1 is conducted (e.g., closed) in response to an enabling level of a clock signal $\phi_{s1'}$, in order to transmit the clock signal $\phi_c$ to the control logic circuit 144. The switch M2 is conducted in response to an enabling level of a clock signal $\phi_{s2'}$, in order to transmit the clock signal $\phi_c$ to the control logic circuit 146. The clock signal $\phi_{s1'}$ is an inverse of a clock signal $\phi_{s1}$, and the clock signal $\phi_{s2'}$ is an inverse of a clock signal $\phi_{s2}$.

Each of the binary capacitor arrays CT1 and CT2 includes capacitors and switches that are controlled by a corresponding one of the control logic circuits 144 and 146. A first terminal of each of capacitors in the binary capacitor array CT1 is configured to receive the input signal $V_{in}$ and is coupled to a node N1. A second terminal of each of capacitors in the binary capacitor array CT1 is configured to selectively receive common mode voltage $V_{refn}$ or $V_{refp}$ under the control of the control logic circuit 144. A first terminal of each of capacitors in the binary capacitor array CT2 is configured to receive the input signal $V_{in}$ and is coupled to a node N2. A second terminal of each of capacitors in the binary capacitor array CT2 is configured to selectively receive common mode voltage $V_{refn}$ or $V_{refp}$ under the control of the control logic circuit 146.

The switching circuitry 120 is configured to couple the binary capacitor arrays CT1 and CT2 to the comparator circuit 142 according to at least one clock signal.

The switching circuitry 120 includes switches S1-S9 and capacitors C2-C3. A first terminal of the switch S1 receives the input signal $V_{in}$. A second terminal of the switch S1 is coupled to the node N1. The switch S1 is closed in response to an enabling level (e.g., high level) of the clock signal $\phi_{s1}$, in order to transmit the input signal $V_{in}$ to the binary capacitor array CT1. A first terminal of the switch S2 receives the input signal $V_{in}$. A second terminal of the switch S2 is coupled to the first terminal of the binary capacitor array CT2. The switch S2 is conducted in response to an enabling level of the clock signal $\phi_{s2}$.

The switch S3 is coupled between the node N1 and a first terminal of the capacitor C2. The switch S3 is conducted in response to an enabling level of a clock signal $\phi_{T1C}$. Under this condition, the sampled input signal $V_{in}$ is provided from the binary capacitor array CT1 to the capacitor C2 for the A/D conversion.

The switch S4 is coupled between the node N2 and the first terminal of the capacitor C2. The switch S4 is conducted in response to an enabling level (e.g., high level) of a clock signal $\phi_{T2C}$. Under this condition, the sampled input signal $V_{in}$ is provided from the binary capacitor array CT2 to the capacitor C2 for the A/D conversion.

Figure 1B:
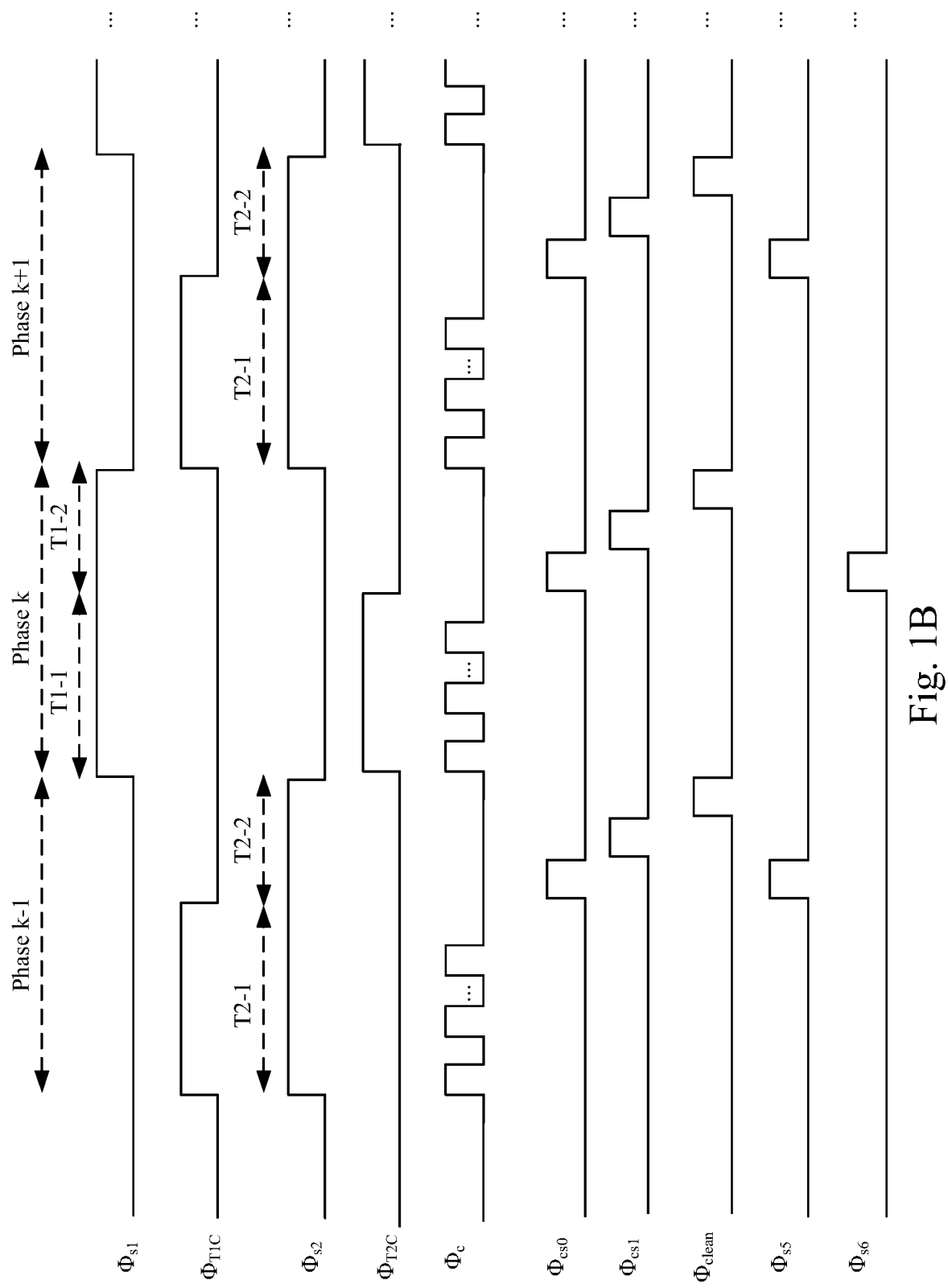
FIG. 1B is a schematic diagram illustrating waveforms of signals in FIG. 1A according to some embodiments of the present disclosure.

The switch S5 is coupled between the node N1 and a first terminal of the capacitor C3. A second terminal of the capacitor C3 is coupled to ground. The switch S5 is conducted in response to an enabling level of a clock signal $\phi_{s5}$. Under this condition, a residue signal on the binary capacitor array CT1 is transferred to the capacitor C3. In some embodiments, the residue signal on the binary capacitor array CT1 is generated in the A/D conversion or after the A/D conversion is completed. In some embodiments, the clock signal $\phi_{s5}$ may be a result of logic AND operation of a clock signal $\phi_{cs0}$ and an inverse of the clock signal $\phi_{s1}$. For example, as shown in FIG. 1B, when the clock signal $\phi_{cs0}$ has the enabling level, and when the clock signal $\phi_{s1}$ has a disabling level (e.g., a low level), the clock signal $\phi_{s5}$ has the enabling level.

The switch S6 is coupled between the node N2 and the first terminal of the capacitor C3. The switch S6 is conducted in response to an enabling level of a clock signal $\phi_{s6}$. Under this condition, a residue signal on the binary capacitor array CT2 is transferred to the capacitor C3. In some embodiments, the residue signal on the binary capacitor array CT2 is generated in the A/D conversion or after the A/D conversion is completed. In some embodiments, the clock signal $\phi_{s6}$ may be a result of logic AND operation of a clock signal $\phi_{cs0}$ and an inverse of the clock signal $\phi_{s2}$. For example, as shown in FIG. 1B, when the clock signal $\phi_{cs0}$ has the enabling level and the clock signal $\phi_{s2}$ has a disabling level, the clock signal $\phi_{s6}$ has the enabling level.

The switch S7 is coupled between the first terminal of the capacitor C2 and ground. A second terminal of the capacitor C2 is coupled to one input terminal (e.g., positive input terminal) of the comparator circuit 142. Another one input terminal (e.g., negative input terminal) of the comparator circuit 142 is coupled to ground. The switch S8 is coupled between the second terminal of the capacitor C2 and the first terminal of the capacitor C3. The switches S7-S8 are conducted in response to an enabling level of a clock signal $\phi_{cs1}$. Under this condition, the capacitor C3 is coupled to the capacitor C2. After the charge sharing of the capacitors C2-C3 is settled, the capacitor C2 stores a residue signal Vres2. The residue signal Vres2 is a charge sharing result of the capacitor C2 and the residue signal previously stored on the capacitor C3.

The switch S9 is coupled between the first terminal of the capacitor C3 and ground. The switch S9 is conducted in response to an enabling level of a clock signal $\phi_{clean}$, in order to reset the capacitor C3 to ground. In some embodiments, the ground mentioned above may be an AC ground.

Reference is made to both of FIGS. 1A and 1B. FIG. 1B is a schematic diagram illustrating waveforms of signals in FIG. 1A according to some embodiments of the present disclosure.

As shown in FIG. 1B, in some embodiments, a time interval of the clock signal $\phi_c$ having the enabling level is within a time interval of the clock signal $\phi_{s1}$ or $\phi_{s2}$ having the enabling level. In other words, when the SAR circuitry 140 performs the A/D conversion, one of the switches S1-S2 is conducted, and the one of the binary capacitor arrays CT1-CT2 samples the input signal $V_{in}$ for the corresponding A/D conversion.

In some embodiments, in a conversion phase k−1, a time interval of the clock signal $\phi_{T1C}$ having the enabling level is within a portion T2-1 of the time interval of the clock signal $\phi_{S2}$ having the enabling level. The portion T2-1 is overlapped with the time interval of the clock signal $\phi_c$ having the enabling level. Time intervals of the clock signals $\phi_{cs0}$, $\phi_{s5}$, $\phi_{cs1}$, and $\phi_{clean}$ having the enabling levels are within a portion T2-2 of the time interval of the clock signal $\phi_{S2}$ having the enabling level. The portion T2-2 follows the portion T2-1.

Similarly, in a conversion phase k, a time interval of the clock signal $\phi_{T2C}$ having the enabling level is within a portion T1-1 of the time interval of the clock signal $\phi_{s1}$ having the enabling level. The portion T1-1 is overlapped with the time interval of the clock signal $\phi_c$ having the enabling level. Time intervals of the clock signals $\phi_{cs0}$, $\phi_{s5}$, $\phi_{cs1}$, and $\phi_{clean}$ having the enabling level are within a portion T1-2 of the time interval of the clock signal $\phi_{S1}$ having the enabling level. The portion T1-2 follows the portion T1-1.

The time interval of the clock signal $\phi_{cs0}$ (or $\phi_{s5}/\phi_{s6}$) having the enabling level follows the time interval of the clock signal $\phi_c$ having the enabling level. In other words, in phase k−1, after the A/D conversion is completed, the switch S5 is conducted to couple the capacitor C3 to the binary capacitor array CT1. In phase k, after the A/D conversion is completed, the switch S6 is conducted to couple the capacitor C3 to the binary capacitor array CT2.

The time interval of the clock signal $\phi_{cs1}$ having the enabling level follows the time interval of the clock signal $\phi_{cs0}$ (or $\phi_{s5}/\phi_{s6}$) having the enabling level. In other words, in phase k−1, after the charge sharing of the binary capacitor array CT1 and the capacitor C3 is settled, the switches S7-S8 are conducted, such that the capacitors C2-C3 are connected. In phase k, after the charge sharing of the binary capacitor array CT2 and the capacitor C3 is settled, the switches S7-S8 are conducted, such that the capacitors C2-C3 are connected.

The time interval of the clock signal $\phi_{clean}$ having the enabling level follows the time interval of the clock signal $\phi_{cs1}$ having the enabling level. In other words, after the charge sharing of the capacitors C2-C3 is settled, the switches S9 is conducted to reset the capacitor C3.

In some embodiments, the clock signal $\phi_{s1}$ is an inverse to the clock signal $\phi_{s2}$. For example, in phase k, the clock signal $\phi_{s1}$ has the enabling level, and the clock signal $\phi_{s2}$ has the disabling level. Under this condition, as shown in FIG. 1A, the switch S1 is conducted, and the binary capacitor array CT1 samples the input signal $V_{in}$ in phase k (hereinafter "$V_{in}$(k)"). The switch S2 is not conducted, and the switch M2 is conducted. Accordingly, the SAR circuitry 140 performs the A/D conversion, under the control of the control logic circuit 146, based on the input signal $V_{in}$(k−1) previously sampled on the binary capacitor array CT2 and a residue signal Vres2(k−1) previously stored on the capacitor C2. Equivalently, the comparator circuit 142 quantizes the combination of the input signal $V_{in}$(k−1) and the residue signal Vres2(k−1) to generate the corresponding digital output $D_{out}$(k). In response to the enabling level of the clock signal $\phi_{cs1}$, the capacitors C2-C3 are connected, and thus the residue signal Vres2(k) is stored by the capacitor C2 at the end of phase k−1. In some embodiments, the residue signal Vres2(k) may indicate quantization error(s) corresponding to the A/D conversion in the phase k−1.

In phase k+1, the clock signal $\phi_{s2}$ has the enabling level, and the clock signal $\phi_{s1}$ has the disabling level. Under this condition, the switch S2 is conducted, and the binary capacitor array CT2 samples the input signal $V_{in}$(k+1). The switch S1 is not conducted, and the switch M1 is conducted. Accordingly, the SAR circuitry 140 performs the A/D conversion, under the control of the control logic circuit 144, based on the input signal $V_{in}$(k) sampled on the binary capacitor array CT1 and the residue signal Vres2(k). Equivalently, the comparator circuit 142 quantizes the combination of the input signal $V_{in}$(k) and the residue signal Vres2(k) to generate the corresponding digital output $D_{out}$(k+1). In response to the enabling level of the clock signal $\phi_{cs1}$, the capacitors C2-C3 are connected, and thus the residue signal Vres2(k+1) is stored by the capacitor C2 at the end of phase k+1.

With this analogy, in each conversion phase, the A/D conversion is executed based on a combination of the input signal $V_{in}$, and the residue signal Vres2 that indicates quantization error(s) in a previous phase. As a result, a noise transfer function having the characteristic of noise shaping of the ADC device 100 can be obtained. Accordingly, a signal-to-noise ratio of the output of the ADC device 100 can be increased.

Figure 2:
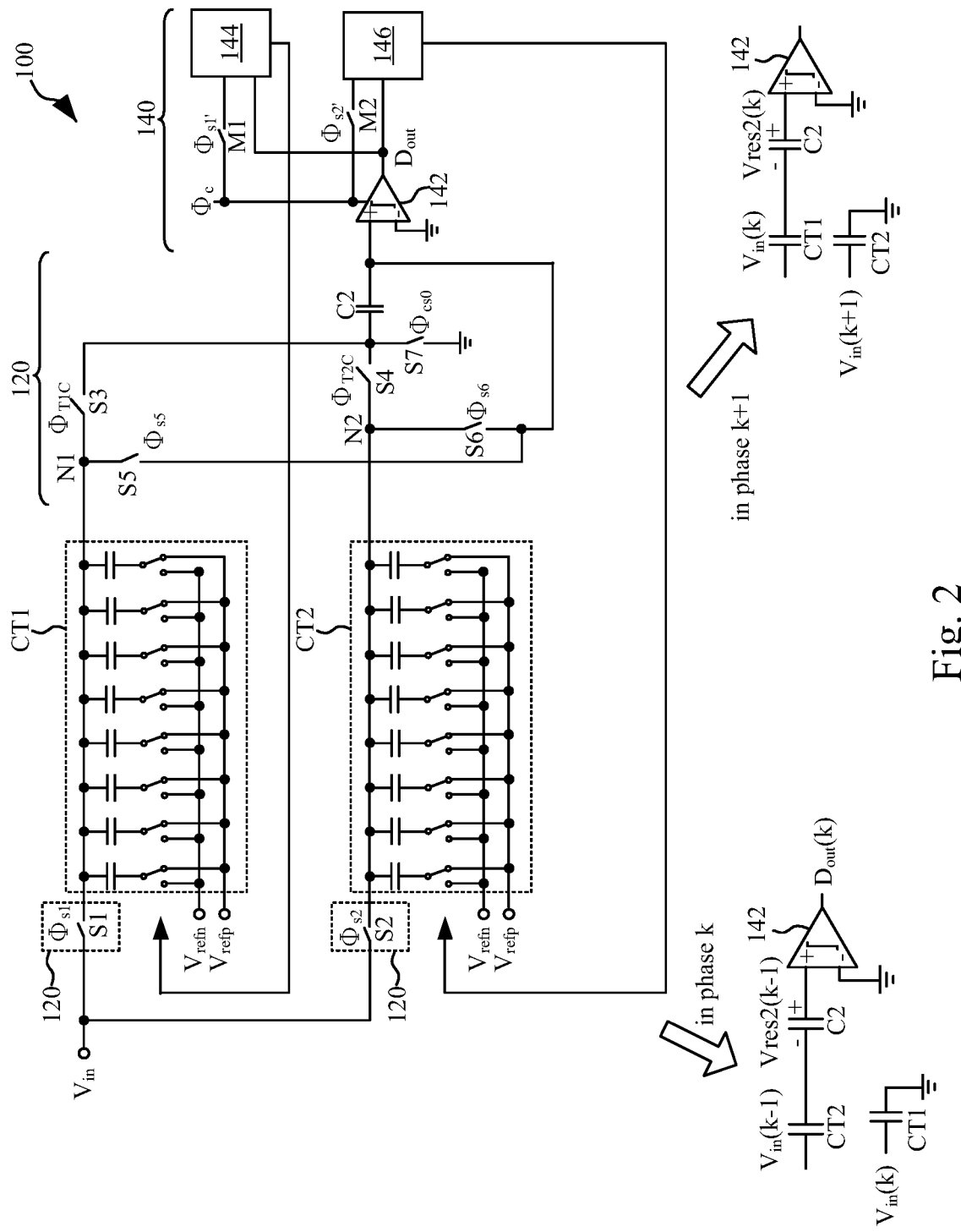
FIG. 2 is a schematic diagram of the ADC device according to some embodiments of the present disclosure.

Reference is made to FIG. 2 and FIG. 1B. FIG. 2 is a schematic diagram of the ADC device 100 according to some embodiments of the present disclosure.

Compared with FIG. 1A, in this example, the switching circuitry 120 only utilizes the switches S1-S7 and the capacitor C2, and the switch S7 is controlled by the clock signal $\phi_{cs0}$. In this example, as operation(s) of the switches S8-S9 are omitted, the time interval of the conversion phase (e.g., phase k−1, k, k+1, . . . ) can be further reduced.

In phase k−1, when the clock signal $\phi_{cs0}$ and the clock signal $\phi_{s5}$ has the enabling level, the switches S5 and S7 are conducted. Under this condition, the binary capacitor array CT1 is connected to the capacitor C2. After the charge sharing of the binary capacitor array CT1 and the capacitor C2. The capacitor C2 stores the residue signal Vres2(k−1).

In phase k, when the clock signal $\phi_c$ has the enabling level, the A/D conversion is performed based on a combination of the sampled input signal $V_{in}$(k−1) and the residue signal Vres2(k−1). When the clock signal $\phi_{cs0}$ and the clock signal $\phi_{s6}$ has the enabling level, the switches S6 and S7 are turned on. Under this condition, the binary capacitor array CT2 is connected to the capacitor C2. After the charge sharing of the binary capacitor array CT2 and the capacitor C2 is settled, the capacitor C2 stores the residue signal Vres2(k). In other words, the switch S6 is conducted to transfer a residue signal generated in the A/D conversion in phase k from the capacitor array CT2 to the capacitor C2. As a result, the capacitor C2 stores the residue signal Vres2(k).

In phase k+1, when the clock signal $\phi_c$ has the enabling level, the A/D conversion is performed based on a combination of the sampled input signal $V_{in}$(k) and the residue signal Vres2(k). As a result, a noise transfer function having the characteristic of noise shaping of the ADC device 100 can be obtained as well.

In the above embodiments, both of the time interval of the SAR circuitry 140 performing the A/D conversion (e.g., time interval of the clock signal $\phi_c$ having the enabling level) and the time interval of the switching circuitry 120 performing the charge sharing (e.g., time intervals of the clock signals $\phi_{cs0}$, $\phi_{cs1}$, and $\phi_{clean}$ having the enabling level, or time interval of clock signal $\phi_{cs0}$) are within the time interval of the conversion phase (e.g., phase k−1, k, k+1, . . . ). In some embodiments, during the charge sharing, the first terminal of the capacitor C2 may be open.

The above configurations of each clock signal and the switching circuitry 120 are given for illustrative purposes, and the present disclosure is not limited thereto.

Figure 3A:
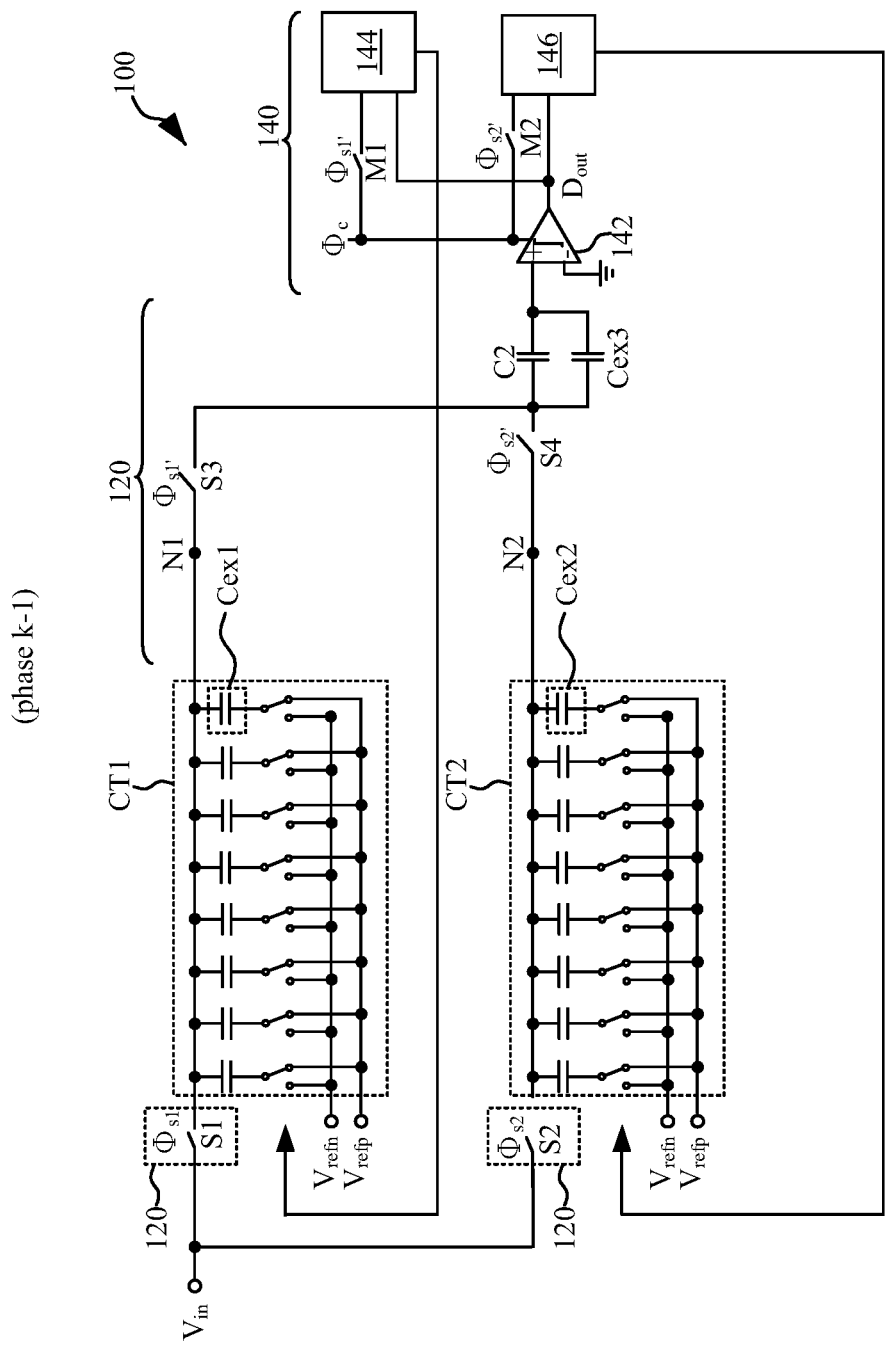
FIG. 3A is a schematic diagram of the ADC device in phase k−1 according to some embodiments of the present disclosure.
Figure 3B:
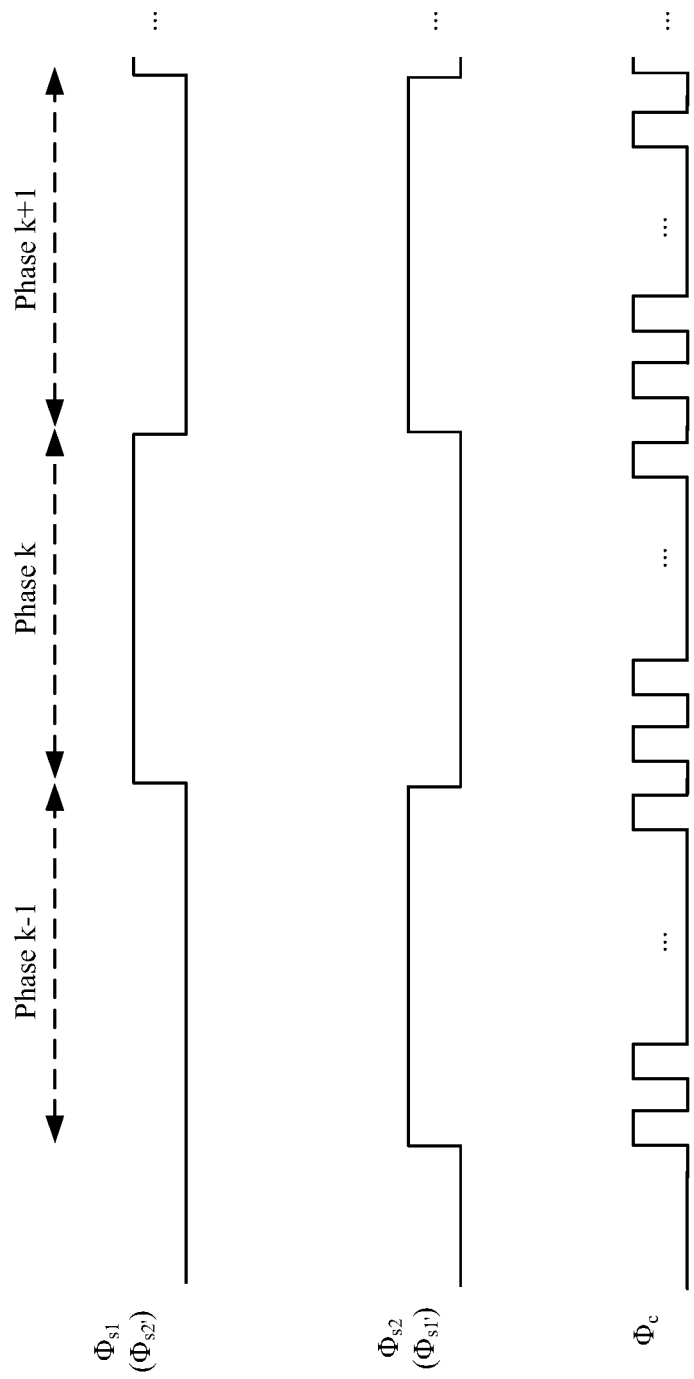
FIG. 3B is a schematic diagram illustrating waveforms of signals in FIG. 3A according to some embodiments of the present disclosure.
Figure 3C:
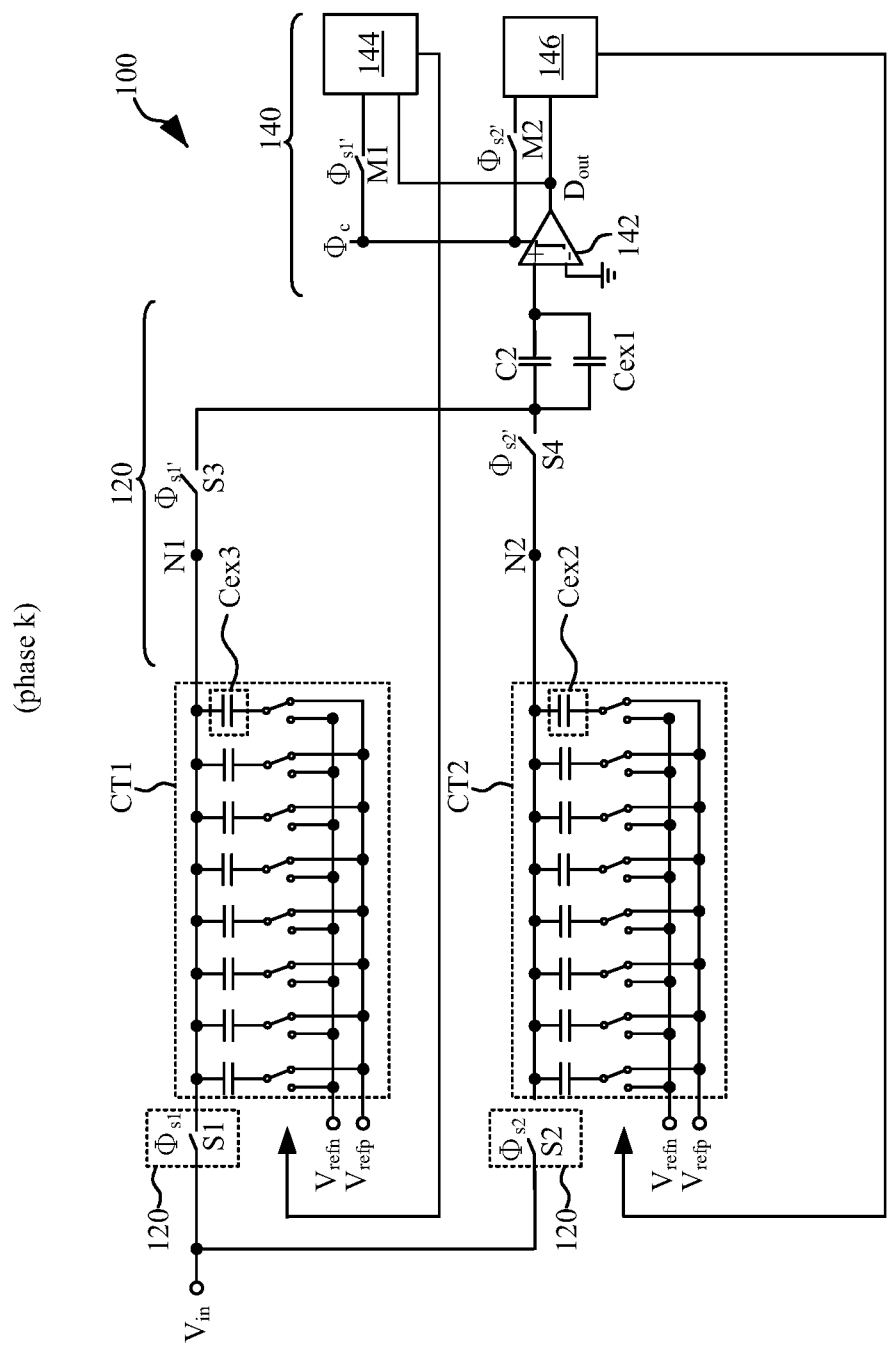
FIG. 3C is a schematic diagram of the ADC device in FIG. 3A in phase k according to some embodiments of the present disclosure.
Figure 3D:
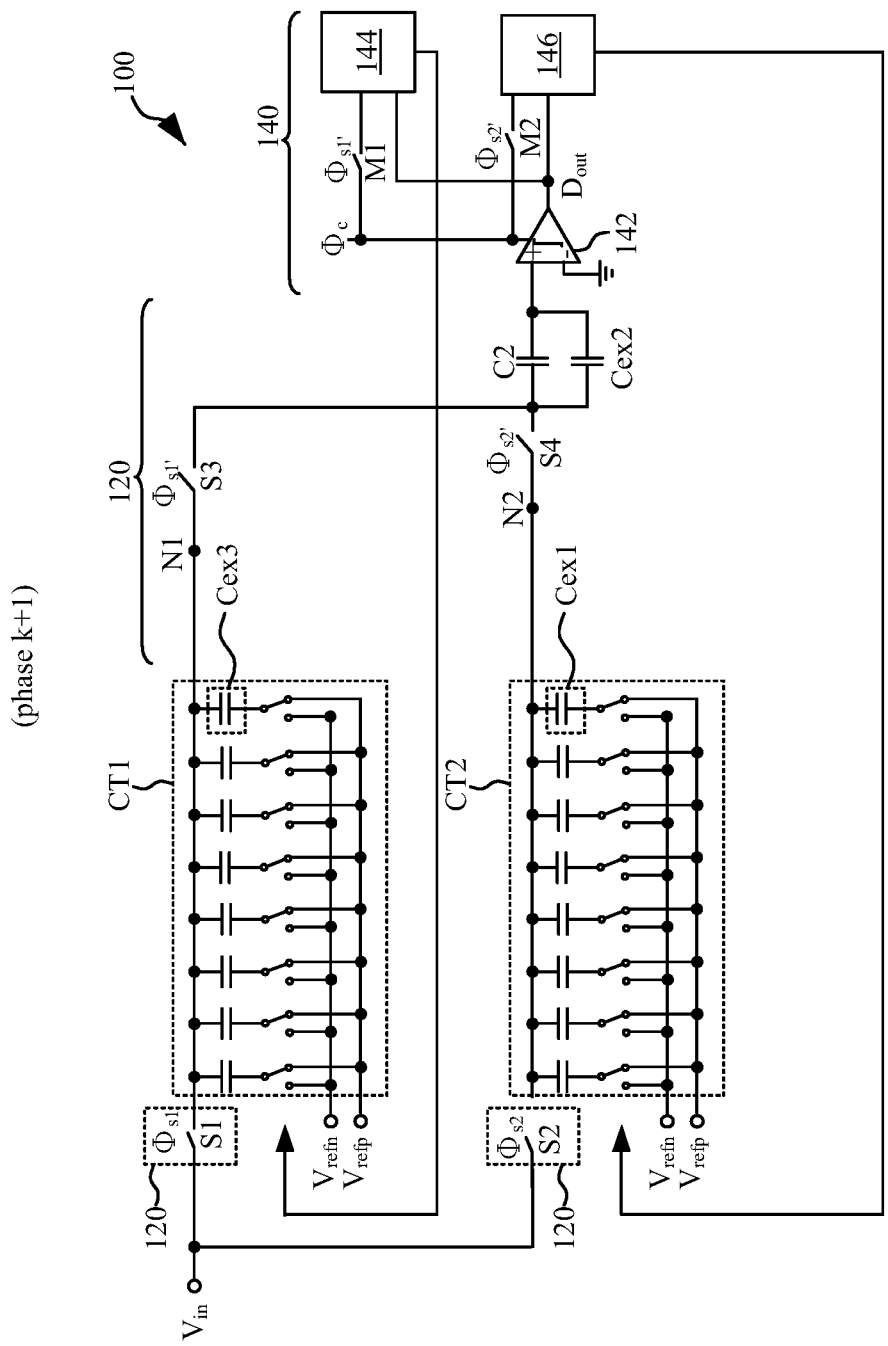
FIG. 3D is a schematic diagram of the ADC device in FIG. 3A in phase k+1 according to some embodiments of the present disclosure.

Reference is made to FIG. 3A to FIG. 3D. FIG. 3A is a schematic diagram of the ADC device 100 in phase k−1 according to some embodiments of the present disclosure. FIG. 3B is a schematic diagram illustrating waveforms of signals in FIG. 3A according to some embodiments of the present disclosure. FIG. 3C is a schematic diagram of the ADC device 100 in phase k according to some embodiments of the present disclosure. FIG. 3D is a schematic diagram of the ADC device 100 in phase k+1 according to some embodiments of the present disclosure.

In this example, the switching circuitry 120 includes switches S1-S4, in which the switch S3 is controlled by the clock signal $\phi_{s1'}$, and the switch S4 is controlled by the clock signal $\phi_{s2'}$. The switching circuitry 120 further includes switched-capacitors Cex1-Cex3 In some embodiments, the switched-capacitors Cex1-Cex3 are configured to be coupled to the binary capacitor array CT1, CT2, and the capacitor C2 by turns, in order to provide a residue signal in a corresponding phase to the SAR circuitry 140. In greater detail, in each conversion phase, two of the switched-capacitors Cex1-Cex3 operate as capacitors in the binary capacitor arrays CT1 and CT2 respectively, and a remaining capacitor of the switched-capacitors Cex1-Cex3 is coupled in parallel with the capacitor C2 to transfer the residue signal.

For example, as shown in FIG. 3A and FIG. 3B, in phase k−1, the switched-capacitor Cex1 is coupled between switch (es) of the binary capacitor array CT1 and the node N1 for the A/D conversion. The switched-capacitor Cex3 is coupled in parallel with the capacitor C2 for charge sharing. Under this condition, the switched-capacitor Cex1 stores the residue signal Vres2(k−1) in the A/D conversion or after the A/D conversion is completed. The switched-capacitor Cex2 is coupled between switch(es) of the binary capacitor array CT2 and the node N2, in order to sample the input signal $V_{in}$(k−1).

As shown in FIG. 3B and FIG. 3C, in phase k, the switched-capacitor Cex2 is coupled between the switch(es) of the binary capacitor array CT2 and the node N2 for the A/D conversion. The switched-capacitor Cex1 is coupled in parallel with the capacitor C2 for charge sharing. Under this condition, the A/D conversion is made based on a combination of the sampled input signal $V_{in}$(k−1) and the residue signal Vres2(k−1) shared by the switched-capacitor Cex1. The switched-capacitor Cex2 stores the residue signal Vres2(k) in the A/D conversion or after the A/D conversion is completed. The switched-capacitor Cex3 is coupled between the switch(es) of the binary capacitor array CT1 and the node N1, in order to sample the input signal $V_{in}$(k).

As shown in FIG. 3B and FIG. 3D, in phase k+1, the switched-capacitor Cex3 is coupled between the switch(es) of the binary capacitor array CT1 and the node N1 for the A/D conversion. The switched-capacitor Cex2 is coupled in parallel with the capacitor C2 for charge sharing. Under this condition, the A/D conversion is made based on a combination of the sampled input signal $V_{in}$(k) and the residue signal Vres2(k) shared by the capacitor Cex2. The switched-capacitor Cex3 stores the residue signal Vres2(k+1) in the A/D conversion or after the A/D conversion is completed. The switched-capacitor Cex1 is coupled between the switch (es) of the binary capacitor array CT2 and the node N2, in order to sample the $V_{in}$(k+1).

With this configuration, as shown in FIG. 3B, only the time interval of the SAR circuitry 140 performing the A/D conversion (e.g., time interval of the clock signal $\phi_c$ having the enabling level) is within the time interval of the conversion phase (e.g., phase k−1, k, k+1, . . . ). Accordingly, the time interval of the conversion phase in this example can be further reduced, and the ADC device 100 equivalently operates in a higher clock rate.

In some embodiments, the clock signal $\phi_c$ may be a group of synchronous clock signals. In some embodiments, the clock signal $\phi_c$ may be a group of asynchronous clock signals. Various settings of the clock signal $\phi_c$ are within the contemplated scope of the present disclosure.

Figure 4:
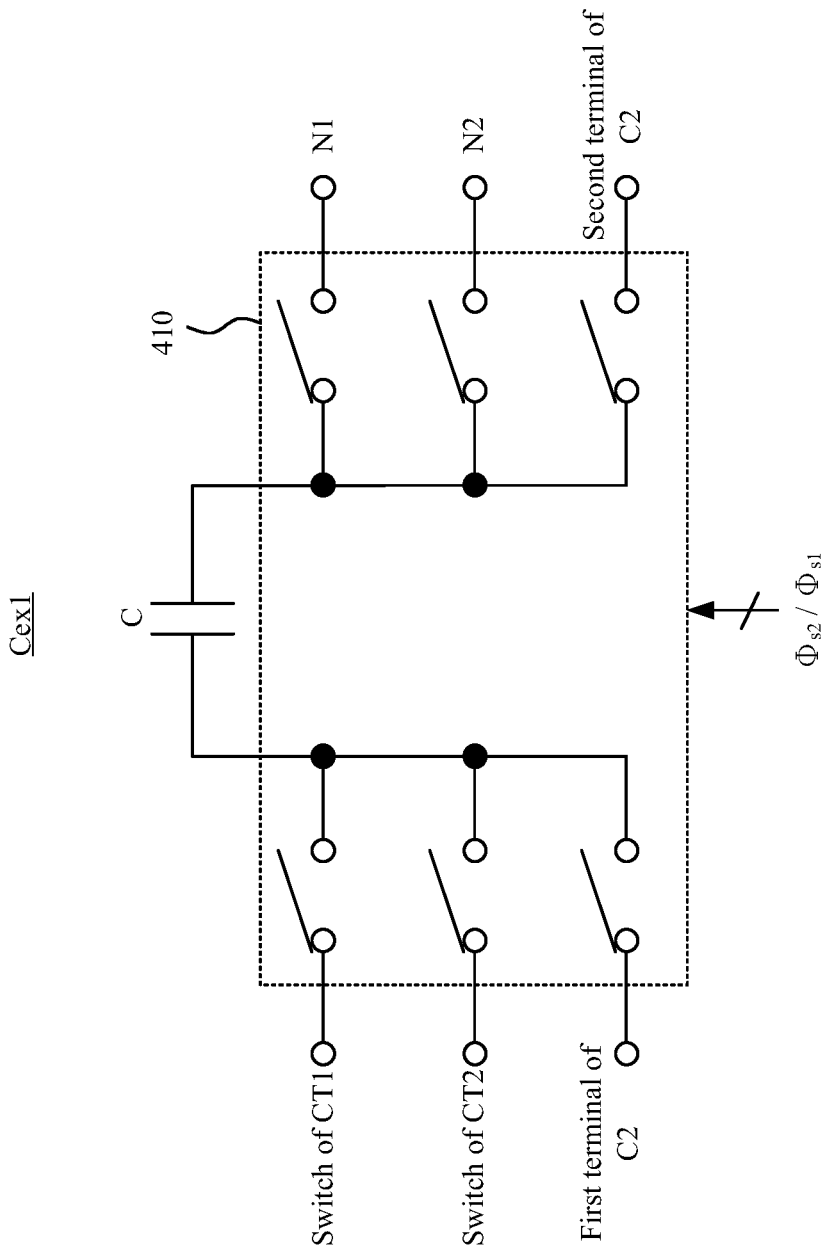
FIG. 4 is a circuit diagram of the switched-capacitor in FIGS. 3A, 3C, and/or 3D according to some embodiments of the present disclosure.

Reference is made to FIG. 4. FIG. 4 is a circuit diagram of the switched-capacitor Cex1 in FIGS. 3A, 3C, and/or 3D according to some embodiments of the present disclosure.

As shown in FIG. 4, the switched-capacitor Cex1 includes a capacitor C and a switching circuit 410. The switching circuit 410 operates as a multiplexer circuit based on a combination of the clock signals $\phi_{s1}$ and $\phi_{s2}$, in order to couple the capacitor C to different terminals of the binary capacitor array CT1 or CT2, or the nodes N1 or N2, or the capacitor C2. Thus, in different phases, the switched-capacitor Cex1 may be set to provide different functions, as discussed in FIGS. 3A, 3C, and 3D.

The implementations of the switched-capacitors Cex2 and Cex3 can be understood with reference to FIG. 4. The implementations of the switched-capacitors Cex1-Cex3 are given for illustrative purposes, and the present disclosure is not limited thereto.

In some embodiments, the comparator circuit 142 in FIGS. 1A, 2, 3A, 3C, and 3D may be implemented with two comparators that are configured to operate with the control logic circuits 144 and 146 respectively.

As described above, the ADC devices of embodiments of the present disclosure are able to provide a circuit architecture that has a noise-shaping function and time-interleaved conversion. As a result, the overall performance of the ADC device can be improved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog-to-digital converter (ADC) device, comprising:
   a plurality of capacitor arrays configured to sample an input signal by turns, wherein when a first capacitor array of the plurality of capacitor arrays is configured to sample the input signal in a first phase, a second capacitor array of the plurality of capacitor arrays is configured to output the input signal sampled in a second phase as a sampled input signal, wherein the first phase is a current phase, and the second phase is prior to the first phase;
   a successive approximation register (SAR) circuitry configured to perform an analog-to-digital conversion on a combination of the sampled input signal and a residue signal generated in the second phase according to a conversion clock signal, in order to generate a digital output; and
   a switching circuitry comprising a first capacitor configured to store the residue signal generated in the second phase, the switching circuitry configured to couple the second capacitor array and the first capacitor to an input terminal of the SAR circuitry, in order to provide the combination of the sampled input signal and the residue signal.

2. The ADC device of claim 1, wherein the switching circuitry is further configured to couple the second capacitor array to the first capacitor after the analog-to-digital conversion in the first phase is performed, in order to store a residue signal generated in the first phase.

3. The ADC device of claim 1, wherein the switching circuitry comprises:
a first switch coupled between a first node of the first capacitor array and a first terminal of the first capacitor, the first switch configured to be conducted in response to an enabling level of a first clock signal;
a second switch coupled between a second node of the second capacitor array and the first terminal of the first capacitor, the second switch configured to be conducted in response to an enabling level of a second clock signal;
a third switch, wherein a first terminal of the third switch is coupled to the first node, a second terminal of the third switch is coupled to a second terminal of the first capacitor, the third switch configured to be conducted in response to an enabling level of a third clock signal; and
a fourth switch, wherein a first terminal of the fourth switch is coupled to the second node, a second terminal of the fourth switch is coupled to the second terminal of the first capacitor, and the fourth switch is configured to be conducted in response to an enabling level of a fourth clock signal.

4. The ADC device of claim 3, wherein a time interval of the conversion clock signal having an enabling level is within a time interval of the first clock signal or the second clock signal having the enabling level.

5. The ADC device of claim 3, wherein the switching circuitry further comprises:
a fifth switch coupled between the first terminal of the first capacitor and ground, the fifth switch configured to be conducted in response to an enabling level of a fifth clock signal.

6. The ADC device of claim 5, wherein a time interval of the third clock signal, the fourth clock signal, or the fifth clock signal having the enabling level follows a time interval of the conversion clock signal having the enabling level.

7. The ADC device of claim 3, wherein the second switch is conducted to connect the second capacitor array to the first capacitor, in order to provide the sampled input signal to the SAR circuitry.

8. The ADC device of claim 7, wherein the fourth switch is conducted to couple the second capacitor array to the first capacitor after the analog-to-digital conversion is performed, in order to store a residue signal generated in the first phase.

9. The ADC device of claim 3, wherein the switching circuitry further comprises:
a second capacitor, wherein a first terminal of the second capacitor is coupled to the second terminal of the fourth switch and the second terminal of the third switch, and a second terminal of the second capacitor is coupled to ground;
a fifth switch coupled between the first terminal of the first capacitor and ground, the fifth switch configured to be conducted in response to an enabling level of a fifth clock signal;
a sixth switch coupled between the second terminal of the first capacitor and the first terminal of the second capacitor, the sixth switch configured to be conducted in response to the enabling level of the fifth clock signal; and
a seventh switch coupled between the first terminal of the second capacitor and ground, the seventh switch configured to be conducted in response to an enabling level of a sixth clock signal, in order to reset the second capacitor.

10. The ADC device of claim 9, wherein the fourth switch is conducted to transfer a residue signal generated in the first phase from the second capacitor array to the second capacitor, and the sixth switch and the fifth switch are conducted to transfer the residue signal generated in the first phase from the second capacitor to the first capacitor.

11. The ADC device of claim 9, wherein a time interval of the sixth clock signal having the enabling level follows a time interval of the fifth clock signal having the enabling level.

12. The ADC device of claim 9, wherein a time interval of the conversion clock signal having the enabling level, a time interval of the third clock signal having the enabling level, and a time interval of the fifth clock signal having the enabling level are within the second phase.

13. The ADC device of claim 9, wherein a time interval of the conversion clock signal having the enabling level, a time interval of the second clock signal having the enabling level, and a time interval of the fourth clock signal having the enabling level are within the first phase.

14. The ADC device of claim 1, wherein the switching circuitry further comprises:
a plurality of switched-capacitors configured to be coupled to the first capacitor array, the second capacitor array, and the first capacitor by turns, in order to provide a residue signal in a corresponding phase to the SAR circuitry.

15. The ADC device of claim 1, wherein the switching circuitry further comprises:
a first switched-capacitor configured to be coupled to a first node of the first capacitor array to operate as one capacitor of the first capacitor array in the second phase, and configured to be coupled in parallel with the first capacitor in the first phase in order to provide the residue signal in the second phase;
a second switched-capacitor configured to be coupled to a second node of the second capacitor array to operate as one capacitor of the second capacitor array in the second phase and the first phase, in order to store the sampled input signal; and
a third switched-capacitor configured to be in parallel with the first capacitor in the second phase to provide a residue signal in a phase prior to the second phase, and configured to be coupled to the first node to operate as the one capacitor of the first capacitor array in the first phase.

16. The ADC device of claim 15, wherein the first switched-capacitor is configured to be coupled to the second node to operate as the one capacitor of the second capacitor array in a next phase of the first phase, the second switched-capacitor is configured to be in parallel with the first capacitor in the next phase of the first phase, and the third switched-capacitor configured to be coupled to the first node to operate as the one capacitor of the first capacitor array in the next phase of the first phase.

17. The ADC device of claim 15, wherein the switching circuitry further comprises:
a first switch coupled between the first node and the first capacitor, and configured to be conducted in the second phase, in order couple the first capacitor array to the first capacitor in series; and a second switch coupled between the second node and the first capacitor, and configured to be conducted in the first phase, in order to couple the second capacitor array to the first capacitor in series.

18. The ADC device of claim 1, wherein the switching circuitry further comprises:

a first switch configured to be conducted in the first phase, in order to transmit the input signal to the first capacitor array; and a second switch configured to be conducted in the second phase, in order to transmit the input signal to the second capacitor array.

19. The ADC device of claim 1, wherein the SAR circuitry comprises:

a comparator circuit configured to perform the analog-to-digital conversion in the first phase based on the combination of the sampled input signal and the residue signal generated in the second phase;

a first control logic circuit configured to control the first capacitor array in the second phase according to the conversion clock signal; and a second control logic circuit configured to control the first capacitor array in the first phase according to the conversion clock signal.

20. The ADC device of claim 19, wherein the SAR circuitry further comprises:

a first switch configured to be conducted in the second phase, in order to transmit the conversion clock signal to the first control logic circuit; and a second switch configured to be conducted in the first phase, in order to transmit the conversion clock signal to the second control logic circuit.

* * * * *